(12) United States Patent
Yoo et al.

(10) Patent No.: US 12,453,012 B2
(45) Date of Patent: Oct. 21, 2025

(54) PRINTED CIRCUIT BOARD AND METHOD OF MANUFACTURING THE SAME

(71) Applicant: SAMSUNG ELECTRO-MECHANICS CO., LTD., Suwon-si (KR)

(72) Inventors: Do Jae Yoo, Suwon-si (KR); Yong Gil Namgung, Suwon-si (KR); Jong Hoon Shin, Suwon-si (KR); Won Ju Jang, Suwon-si (KR); Yun Hwan Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 357 days.

(21) Appl. No.: 18/102,285

(22) Filed: Jan. 27, 2023

(65) Prior Publication Data
US 2024/0032201 A1     Jan. 25, 2024

(30) Foreign Application Priority Data
Jul. 19, 2022 (KR) .......................... 10-2022-0088934

(51) Int. Cl.
*H05K 1/02*     (2006.01)
*H05K 1/03*     (2006.01)
*H05K 1/05*     (2006.01)
*H05K 1/18*     (2006.01)
*H05K 3/00*     (2006.01)
*H05K 3/10*     (2006.01)

(52) U.S. Cl.
CPC .......... *H05K 1/185* (2013.01); *H05K 1/0296* (2013.01); *H05K 1/0306* (2013.01); *H05K 1/053* (2013.01); *H05K 3/10* (2013.01); *H05K 2201/0206* (2013.01); *H05K 2203/013* (2013.01)

(58) Field of Classification Search
CPC .... H05K 1/0296; H05K 1/0306; H05K 1/053; H05K 1/185; H05K 1/02; H05K 1/03; H05K 1/05; H05K 1/18; H05K 2201/0206; H05K 2203/013; H05K 3/10; H05K 3/28; H05K 3/3452; H05K 3/01; H05K 2203/0574; H05K 2203/0588; B23K 1/0016
USPC .............. 361/761; 174/257; 228/175, 180.22
See application file for complete search history.

(56) References Cited

U.S. PATENT DOCUMENTS

| | | | |
|---|---|---|---|
| 2012/0103665 A1* | 5/2012 | Chan ................... | B23K 1/0016 228/175 |
| 2023/0247769 A1* | 8/2023 | Han ....................... | H05K 3/28 174/250 |

FOREIGN PATENT DOCUMENTS

| | | |
|---|---|---|
| KR | 10-2004-0004380 A | 1/2004 |
| KR | 10-2006-0091481 A | 8/2006 |
| WO | 2002/25375 A2 | 3/2002 |

\* cited by examiner

*Primary Examiner* — Timothy J Thompson
*Assistant Examiner* — Guillermo J Egoavil
(74) *Attorney, Agent, or Firm* — Morgan Lewis & Bockius LLP

(57) ABSTRACT

A printed circuit board (PCB) includes a solder resist layer including at least one of an opening and a depression and a solder resist patch disposed in at least one of the opening and the depression to have an interface with the solder resist layer in at least one of the opening and the depression.

24 Claims, 12 Drawing Sheets

PRINTED CIRCUIT BOARD AND METHOD OF MANUFACTURING THE SAME

CROSS-REFERENCE TO RELATED APPLICATION

This application claims benefit of priority to Korean Patent Application No. 10-2022-0088934 filed on Jul. 19, 2022 in the Korean Intellectual Property Office, the disclosure of which is incorporated herein by reference in its entirety.

TECHNICAL FIELD

The present disclosure relates to a printed circuit board and a method for manufacturing the same.

BACKGROUND

Printed circuit boards (PCBs) may provide an electrical connection path between components or integrated circuits (ICs), and components or ICs may be mounted on or embedded in the PCBs through solder. Solder may electrically connect components or ICs to PCBs through a reflow process.

A solder resist may be disposed on an uppermost layer or a lowermost layer of PCBs, and a portion of an electrical connection path in the PCBs may be exposed externally. The exposed electrical connection path may be efficiently connected to the solder through a reflow process and may be electrically connected to a component or an IC through the solder.

As the performance of ICs (e.g., processors, memories) has gradually increased, the degree of integration of ICs has also gradually increased and a spacing between input/output (I/O) terminals of semiconductor chips and the size of each of the I/O terminals has also gradually decreased. As a result, the degree of integration of an electrical connection path that PCBs may provide has gradually increased and the difficulty of forming solder resists has also gradually increased.

For example, PCBs have been increasingly widely used in devices requiring a long electrical connection path, such as installed electronic devices (including servers) or electric devices (including vehicles). PCBs used in these devices may have a large horizontal area or a large number of conductive layers, and the difficulty of forming solder resists may be higher.

As the difficulty of forming solder resists is higher, a defect rate of the solder resist may increase. For example, as the difficulty of forming solder resists is higher, the possibility of an occurrence of a point at which a conductive layer is exposed to be different from the design during a manufacturing process of the PCB may increase and the possibility of an electrical short may further increase.

SUMMARY

An aspect of the present disclosure may provide a printed circuit board including an efficiently formed solder resist and a method for manufacturing a printed circuit board, capable of efficiently reducing a defect rate of a solder resist.

According to an aspect of the present disclosure, a printed circuit board (PCB) may include: a solder resist layer including at least one of an opening and a depression; and a solder resist patch disposed in at least one of the opening and the depression to have an interface with the solder resist layer in at least one of the opening and the depression.

According to another aspect of the present disclosure, a printed circuit board (PCB) may include: an insulating layer; a conductive layer disposed on the insulating layer; and a solder resist structure constituting a solder resist layer and having at least one concave portion located on at least a portion of the conductive layer on an upper surface of the solder resist layer. An average of the center thickness of the at least one concave portion may be greater than 10% and less than 70% of a thickness of a portion not overlapping the at least one concave portion in the solder resist structure.

According to another aspect of the present disclosure, a method for manufacturing a printed circuit board (PCB) may include: curing a solder resist layer of an unfinished PCB; obtaining thickness and size measurement values of a plurality of points of the solder resist layer; filling a solder resist material at a point corresponding to a thickness and size measurement value falling within a target range, among the thickness and size measurement values of the plurality of points; and curing the point filled with the solder resist material, among the plurality of points, and measuring and checking whether a thickness and size of the filled point after curing falls within the target range.

According to another aspect of the present disclosure, a printed circuit board (PCB) may include: an insulating layer; a conductive layer disposed on the insulating layer and including a first conductive pattern and a second conductive pattern; and a solder resist structure comprising a solder resist layer and a solder resist pattern. A property of the solder resist pattern may be different from a property of the solder resist layer. The solder resist layer may cover a portion of the insulating layer and have an opening exposing a portion of the first conductive pattern. The solder resist pattern may be disposed on the second conductive pattern and be in contact with the solder resist layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments of the present disclosure will now be described in detail with reference to the accompanying drawings.

Figure 1A:
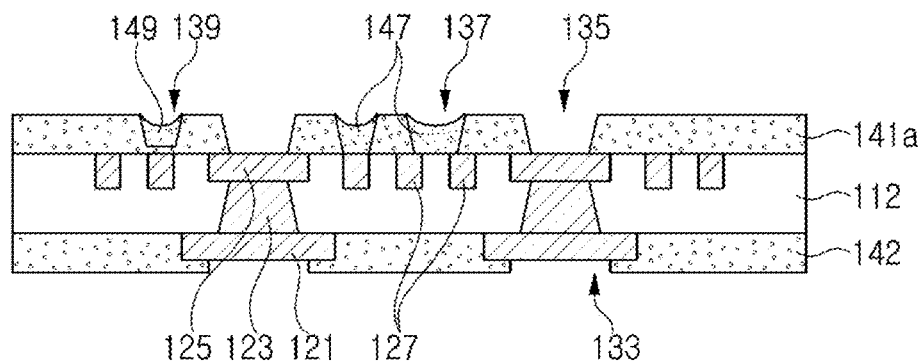
FIGS. 1A and 1B are side views illustrating vertical cross-sections of a printed circuit board according to an exemplary embodiment in the present disclosure.

Referring to FIG. 1A, a printed circuit board (PCB) 100a according to an exemplary embodiment in the present disclosure may include a solder resist layer 141a and solder resist patches 147 and 149 (e.g., solder resist patterns 147 and 149).

The solder resist layer 141a may include at least one of an opening 137 and a depression 139. The opening 137 may be located in a portion of each portion of the conductive layer 127 that is exposed externally differently from the design during a process of forming the solder resist layer 141a. The depression 139 may be located in a portion of each portion of the conductive layer 127 that is likely to be exposed externally, differently from the design later or to cause an electrical short during the process of forming the solder resist layer 141a.

The solder resist patches 147 and 149 may be disposed in at least one of the opening 137 and the depression 139 to form an interface with the solder resist layer 141a in at least one of the opening 137 and the depression 139.

Unlike the design, the solder resist patch 147 may efficiently prevent the conductive layer 127 from being exposed through the opening 137, and unlike the design, the solder resist patch 149 may efficiently reduce the possibility that the conductive layer 127 is exposed later through the depression 139 or efficiently reduce the possibility of an electrical short of the conductive layer 127.

For example, the interface between the solder resist patches 147 and 149 and the solder resist layer 141a may be identified by analysis using at least one of a micrometer, transmission electron microscopy (TEM), atomic force microscope (AFM), scanning electron microscope (SEM), focused ion beam (FIB), an optical microscope and a surface profiler.

For example, the interface between the solder resist patches 147 and 149 and the solder resist layer 141a may be formed as a material included in the solder resist layer 141a and a material included in the solder resist patches 147 and 149 are different from each other. Here, the different materials may mean that contents of inorganic fillers that may be included in the solder resist are different. That is, the solder resist patches 147 and 149 and the solder resist layer 141a may have different material properties.

For example, the interface between the solder resist patches 147 and 149 and the solder resist layer 141a may be formed by a difference in curing time between the solder resist layer 141a and the solder resist patches 147 and 149. Here, the difference in curing time may include a time difference between before and after the solder resist patches 147 and 149 are disposed in at least one of the opening 137 and the depression 139.

For example, the interface between the solder resist patches 147 and 149 and the solder resist layer 141a may provide surface tension in a side surface of at least one of the opening 137 and the depression 139 when the solder resist patches 147 and 149 are disposed.

Accordingly, upper surfaces of the solder resist patches 147 and 149 may have a more concave than an upper surface of the solder resist layer 141a. Here, the solder resist layer 141a may be in a solid state, and the solder resist patches 147 and 149 may be in a liquid state from when immediately after being disposed in at least one of the opening 137 and the depression 139 until cured, but is not limited thereto. Alternatively, a thickness variation of the solder resist patches 147 and 149 may be greater than a thickness variation of the solder resist layer 141a.

Figure 2A:
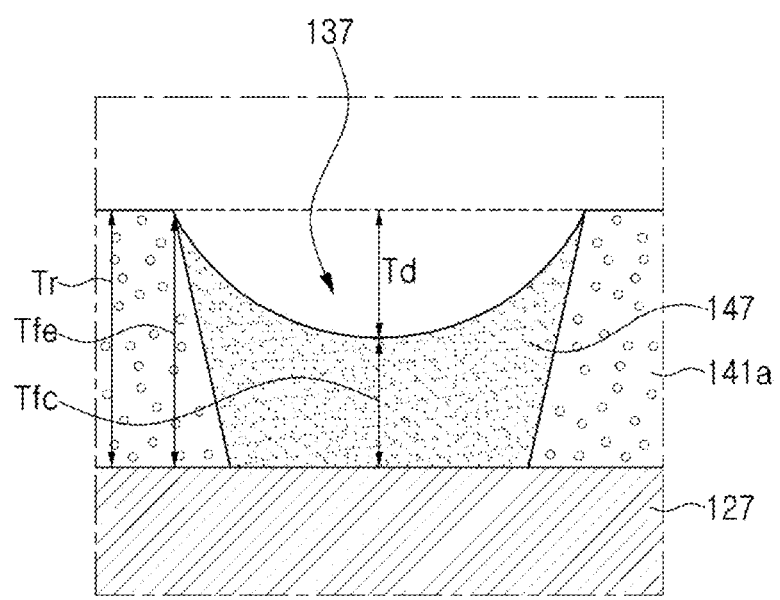
FIG. 2A is an enlarged side view of a solder resist structure of a printed circuit board (PCB) according to an exemplary embodiment in the present disclosure.

Referring to FIG. 2A, a thickness Tr of the solder resist layer 141a may be relatively constant, but a difference between a center thickness Tfc and a maximum thickness Tfe of the solder resist patch 147 may be relatively large. For example, the thickness Tr of the solder resist layer 141a may be as thin as less than 30 μm.

Considering the difference between the center thickness Tfc and the maximum thickness Tfe of the solder resist patch 147, the center thickness Tfc of the solder resist patch 147 disposed in the opening 137 may be greater than 30% and less than 90% of the center thickness (Tfc+Td) of the opening 137. Accordingly, unlike the design, the conductive layer 127 may be efficiently prevented from being exposed through the opening 137.

For example, a volume of the solder resist patch 147 may be determined before the solder resist patch 147 is disposed, and the center thickness Tfc of the solder resist patch 147 may be determined to fall within more than 30% and less than 90% of the center thickness (Tfc+Td) of the opening 137. Even when the solder resist patch is disposed in the depression, a volume of the solder resist patch may be determined to be relatively small, and the center thickness Tfc of the solder resist patch 147 may be determined to fall within more than 30% and less than 90% of the center thickness (Tfc+Td) of the opening 137.

Here, the thickness Tr of the solder resist layer 141a, the center thickness Tfc of the solder resist patch 147, and the center thickness (Tfc+Td) of the opening 137 may be measured in a cross-section of a PCB exposed by vertically cutting the center of one or two openings 137. The thickness Tr of the solder resist layer 141a may be measured as an average value of thickness values of corresponding points in the cross-section. The center thickness Tfc of the solder resist patch 147 and the center thickness Tfc+Td of the opening 137 may also be measured as average values of respective values of the plurality of openings 137. At least one of a micrometer, TEM, AFM, SEM, FIB, optical microscope, and surface profiler may obtain a photograph of the cross-section, and a thickness and size may be measured based on the photograph.

Figure 1B:
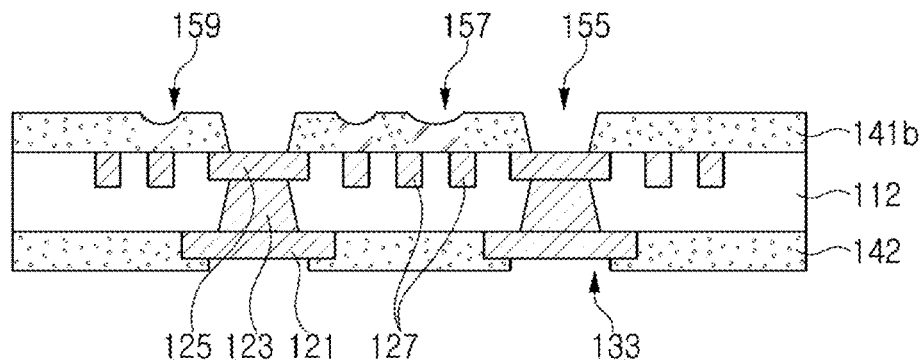

Referring to FIGS. 1A and 1B, the PCBs 100a and 100b according to an exemplary embodiment in the present disclosure may further include at least one of an insulating layer 112, pads 121 and 125, interlayer vias 123, a conductive layer 127, and an additional solder resist layer 142.

The number of layers of the insulating layer 112 and the number of layers of the conductive layer 127 may be plural, and the plurality of insulating layers 112 and the plurality of conductive layers 127 may be alternately stacked. The interlayer via 123 may vertically connect the plurality of conductive layers 127 and pass through at least one of the plurality of insulating layers 112.

For example, each of the plurality of conductive layers 127 may include a wiring to provide an electrical connection path between the PCBs 100a and 100b, and may include a conductive plane disposed in a portion in which the wiring is not located. The insulating layer 112 may provide insulating properties between the plurality of conductive layers 127. Portions of the plurality of conductive layers 127 designed not to be exposed may be disposed between the insulating layer 112 and the solder resist patches 147 and 149.

The pads 121 and 125 and the connection openings 133 and 135 may provide a space in which solder is disposed so that the conductive layer 127 is electrically connected to the outside of the PCBs 100a and 100b. Therefore, unlike the opening 137, the connection openings 133 and 135 may be formed to expose the pads 121 and 125 to the outside according to design. Therefore, the solder resist patches 147 and 149 are not disposed in the connection openings 133 and 135. In this case, the pad 125, as a first conductive pattern, may be exposed by the connection opening 135.

The insulating layer 112 may include a material different from that of the solder resist layer 141a or the solder resist patches 147 and 149. For example, the insulating layer 112 may be a copper clad laminate (CCL), ABF, prepreg, FR-4, bismaleimide triazine (BT), a photo imagable dielectric (PID) resin, and may be a thermosetting resin, such as an epoxy resin, a thermoplastic resin, such as polyimide, and at least selected from the group consisting of a resin of polytetrafluoroethylene (PTFE), glass series, and ceramic series (e.g., low temperature co-fired ceramic (LTCC).

A group of materials that may be included in the solder resist layer 141a or the solder resist patches 147 and 149 may be selected from a material that may be used as a known solder resist among the group of materials of the insulating layer 112, but is not limited thereto.

The additional solder resist layer 142 may include the same material as that of the solder resist layer 141a or the solder resist patches 147 and 149 and may be formed in the same manner as that of the solder resist layer 141a. For example, since the additional solder resist layer 142 may not contact the conductive layer 127, the solder resist patches 147 and 149 may not be required.

For example, materials included in the conductive layer 127 and the interlayer via 123 may be at least one of copper (Cu), silver (Ag), palladium (Pd), aluminum (Al), nickel (Ni), titanium (Ti), gold (Au), and platinum (Pt). For example, the conductive layer 127 may be implemented using a semi-additive process (SAP), a modified semi-additive process (MSAP), or a subtractive method.

Referring to FIG. 1B, the PCB 100b according to an exemplary embodiment in the present disclosure may include a solder resist structure 141b. The solder resist structure 141b may be a structure in which the solder resist layer 141a of FIG. 1A and the solder resist patches 147 and 149 are integrated.

Accordingly, the solder resist structure 141b may form a solder resist layer and may have at least one concave portion 157 or 159 (e.g., solder resist pattern 157 or 159) formed in a position corresponding to the solder resist patch 147 or 149 of FIG. 1A, but is not limited thereto. For example, at least one of the concave portions 157 and 159 may be formed by surface tension in a defect occurring in the process of forming the solder resist structure 141b, as the defect is filled. In this case, a portion of the conductive layer below the concave portion 157 or 159 or a portion of the conductive layer below the opening 137 or 139 may be as a second conductive pattern, on which the solder resist patch 147 or 149 is disposed.

Therefore, referring to FIG. 2A, an average of the center thicknesses Td of each of the at least one concave portion that may correspond to the opening 137 may be greater than 10% and less than 70% of the thickness Tr of a portion that does not overlap the at least one concave portion in the solder resist structure. Accordingly, the solder resist structure 141b may have a structure effectively preventing defects occurring during the formation process.

For example, when the thickness Tr is as thin as less than 30 μm, the center thickness Td of the concave portion having the thickest center thickness in the at least one concave portion may be less than 50% of the thickness Tr. Accordingly, the thickness of the solder resist structure 141b may be stably reduced.

Referring back to FIG. 1B, for example, a thickness variation of each of the at least one concave portion 157 and 159 may be greater than a thickness variation of the connection openings 133 and 135. For example, each of the at least one concave portion 157 or 159 may be more concave than a portion of the solder resist structure 141b that does not vertically overlap the at least one concave portion 157 or 159.

In the solder resist structure 141b, an inorganic filler content (including 0%) of a portion between the at least one concave portion 157 and 159 and at least a portion of the conductive layer 127 may be lower than an inorganic filler content of the rest of the solder resist structure 141b, but is not limited thereto.

Figure 2B:
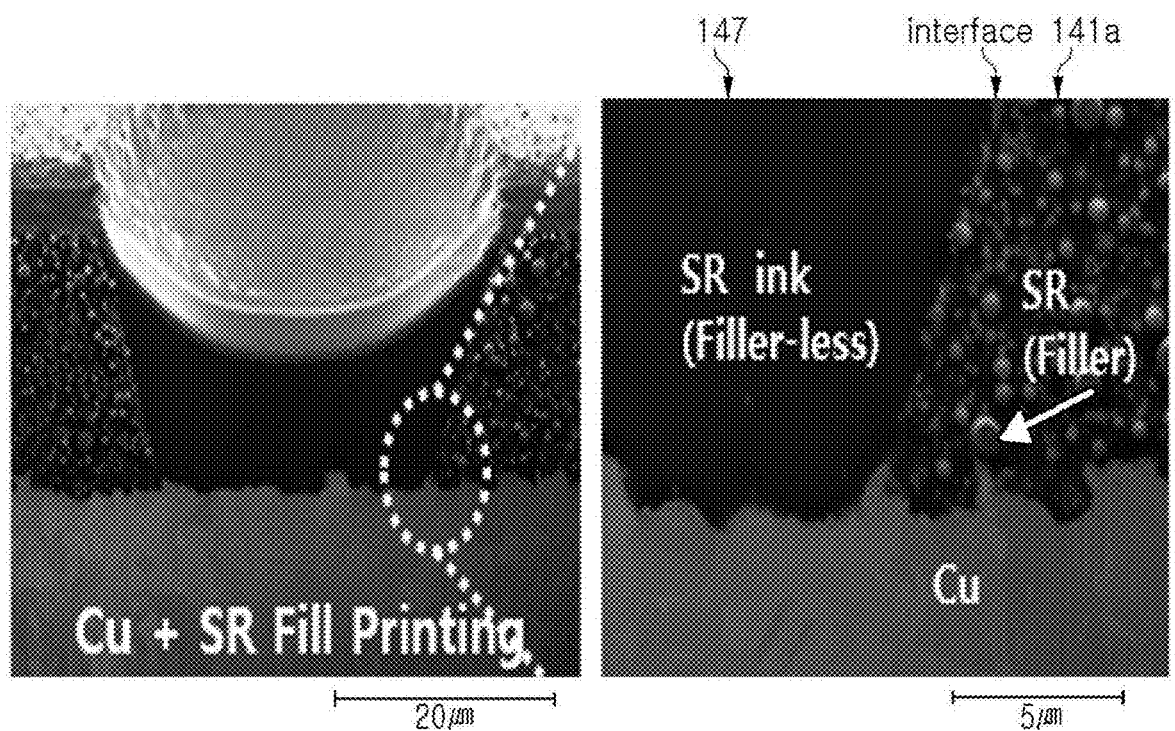
FIGS. 2B and 2C are photographs illustrating a solder resist structure of a PCB according to an exemplary embodiment in the present disclosure.

Referring to FIG. 2B, an interface between the solder resist patch 147 and the solder resist layer 141a and the inorganic filler included in the solder resist layer 141a may be identified by a photograph.

The inorganic filler content of the solder resist layer 141a may be higher than the inorganic filler content (including 0%) of the solder resist patch 147. For example, the solder resist layer 141a may include a relatively large amount of inorganic filler and be formed in a solid state, and the solder resist patch 147 may include no inorganic filler and be formed in a liquid state.

Figure 2C:
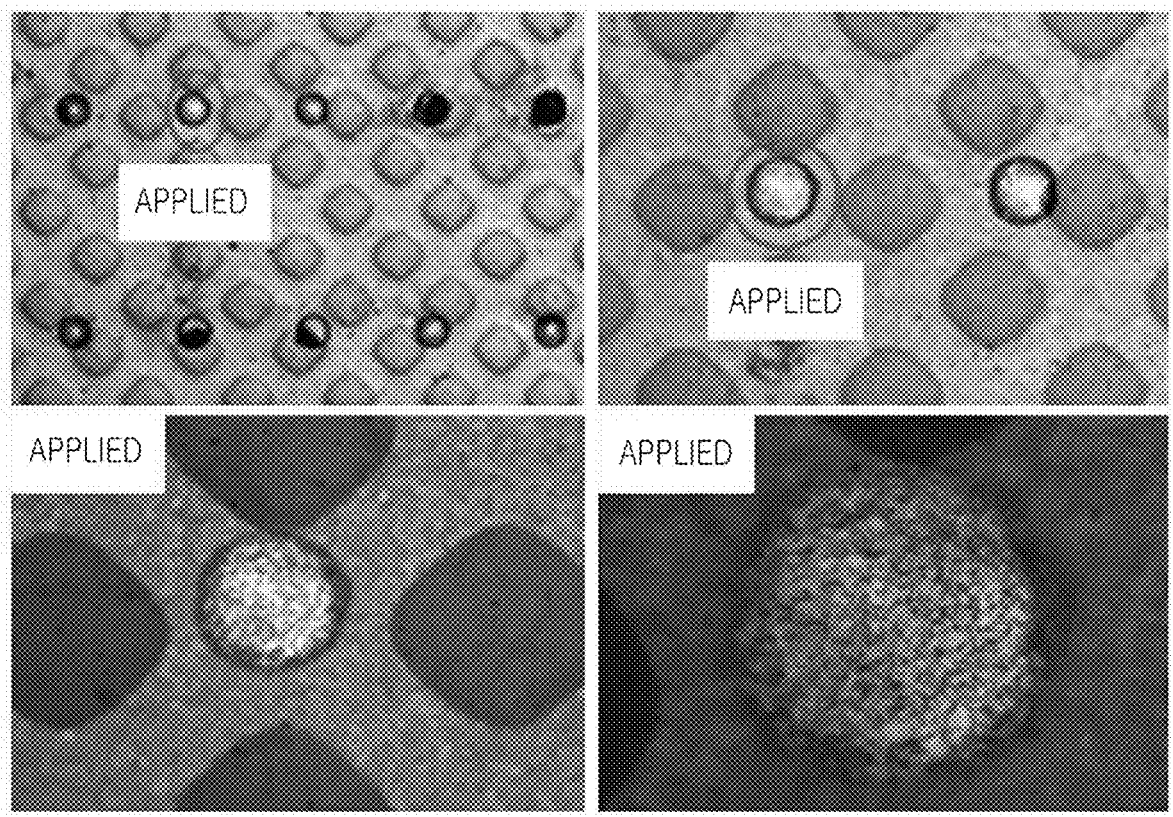

Referring to FIGS. 1B and 2C, brightness of a portion between at least one concave portion 157 and 159 and at least a portion of the conductive layer 127 in the solder resist structure 141b may be different from brightness of the rest of the solder resist structure 141b. In this case, a property (e.g., an optical property) of the portion between at least one concave portion 157 and 159 and at least a portion of the conductive layer 127 in the solder resist structure 141b may be different from a property of the rest of the solder resist structure 141b. For example, the difference in brightness may be caused by a difference in inorganic filler content or a difference in density, but is not limited thereto.

Figure 3A:
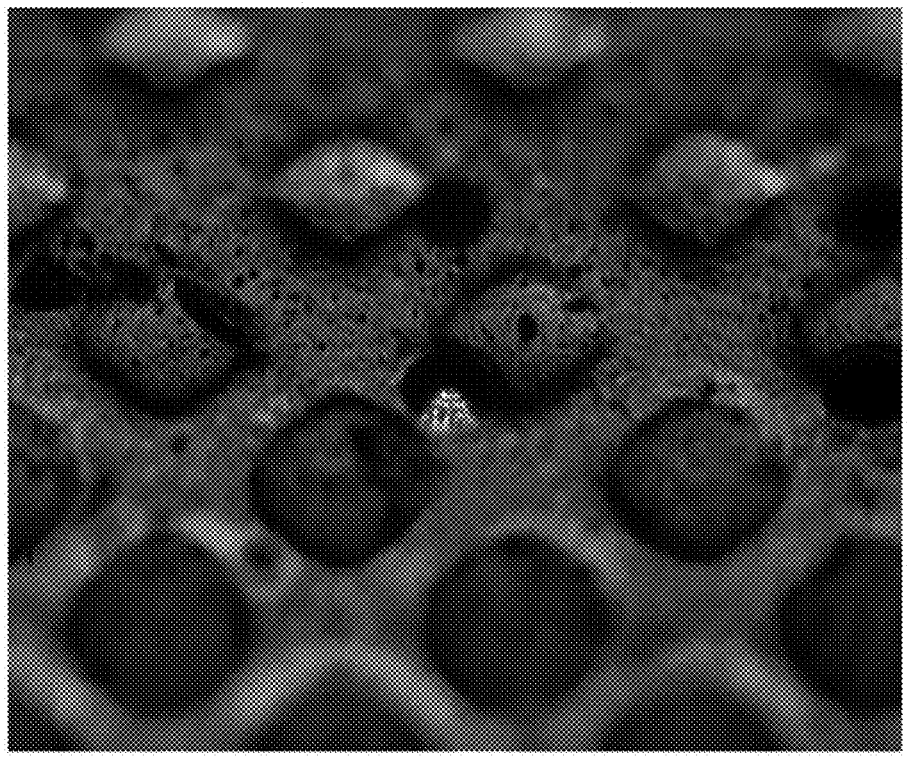
FIG. 3A is a photograph illustrating a state before a solder resist patch of a PCB is disposed according to an exemplary embodiment in the present disclosure.
Figure 3B:
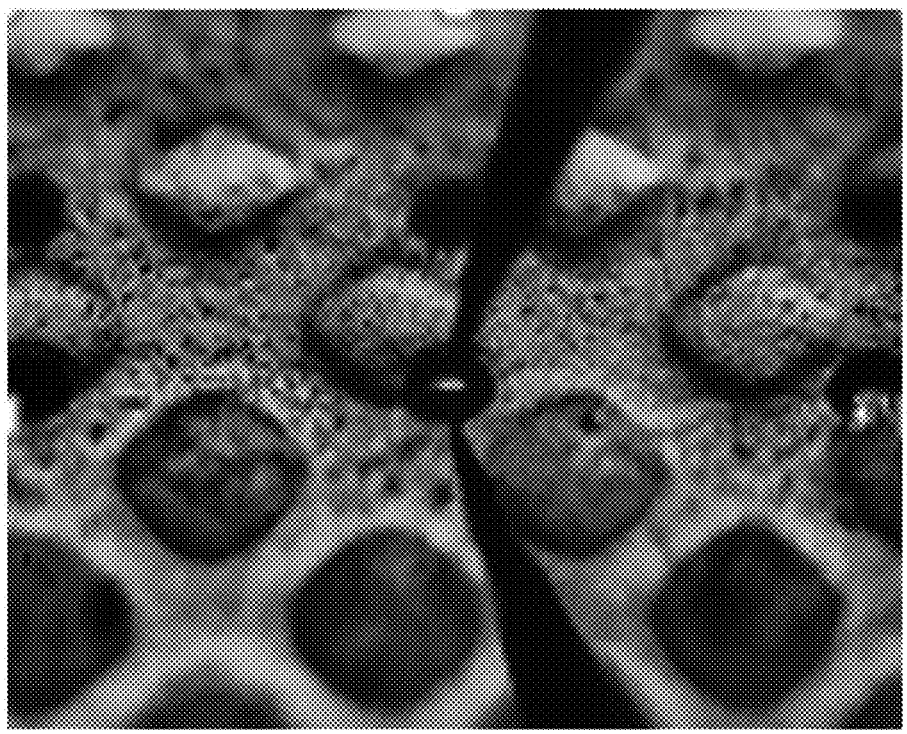
FIG. 3B is a photograph illustrating a state during which a solder resist patch of a PCB is disposed according to an exemplary embodiment in the present disclosure.

The center of the photograph of FIG. 3A shows a structure in which an opening is formed to be different from the design in the solder resist layer to expose the conductive layer to the outside, and the center of the photograph of FIG.

3B shows a structure in which a solder resist patch is injected into the opening of FIG. 3A by an ink-jet method.

Figure 3C:
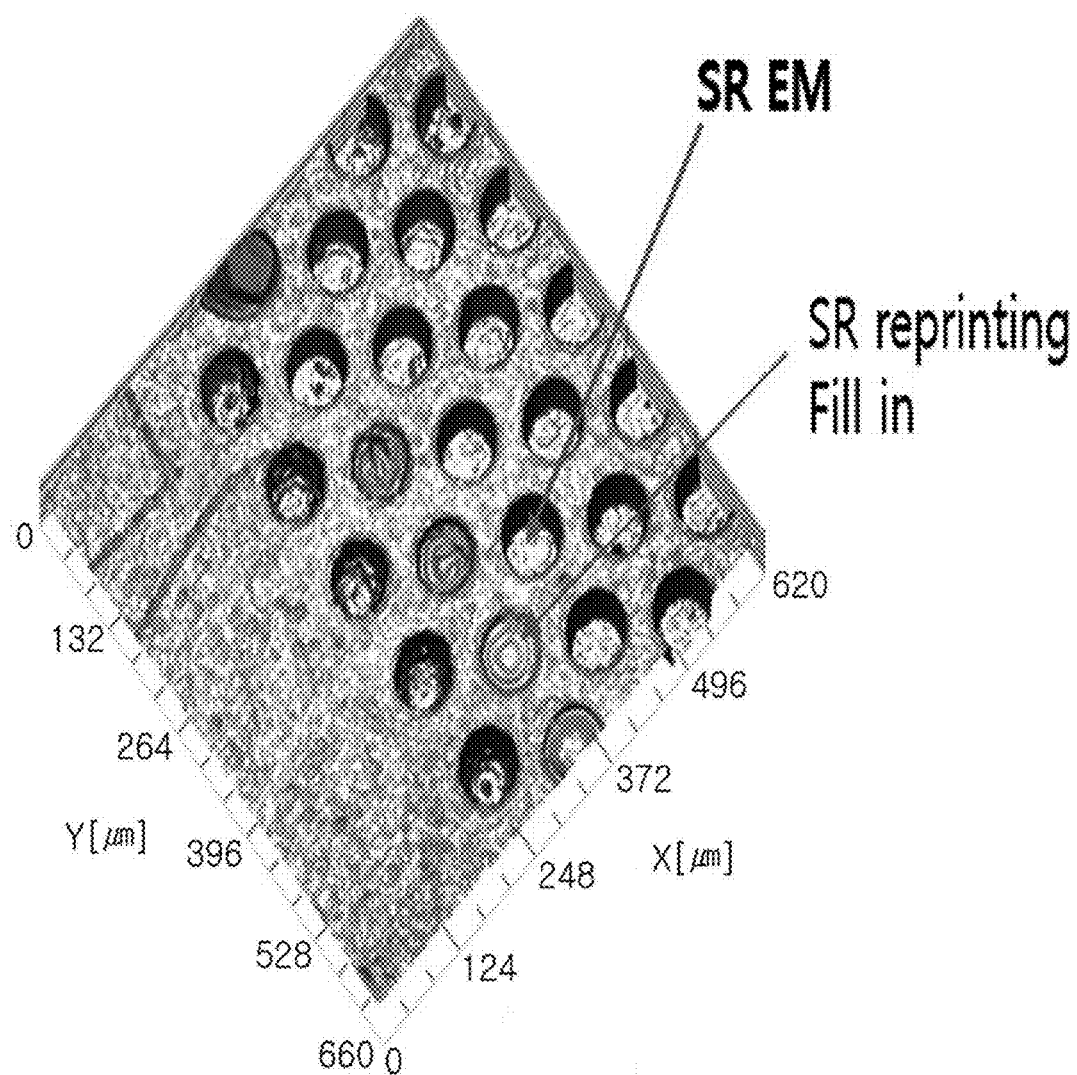
FIG. 3C is a photograph illustrating a state in which solder resist patch is disposed only in some of a plurality of openings/depressions of a solder resist layer of a PCB according to an exemplary embodiment in the present disclosure.

The photograph of FIG. 3C shows a PCB prepared for measuring a thickness and size of an opening/depression (SR EM) in which a solder resist patch is not disposed and an opening/depression (SR reprinting Fill in) in which a solder resist patch is disposed.

Figure 4A:
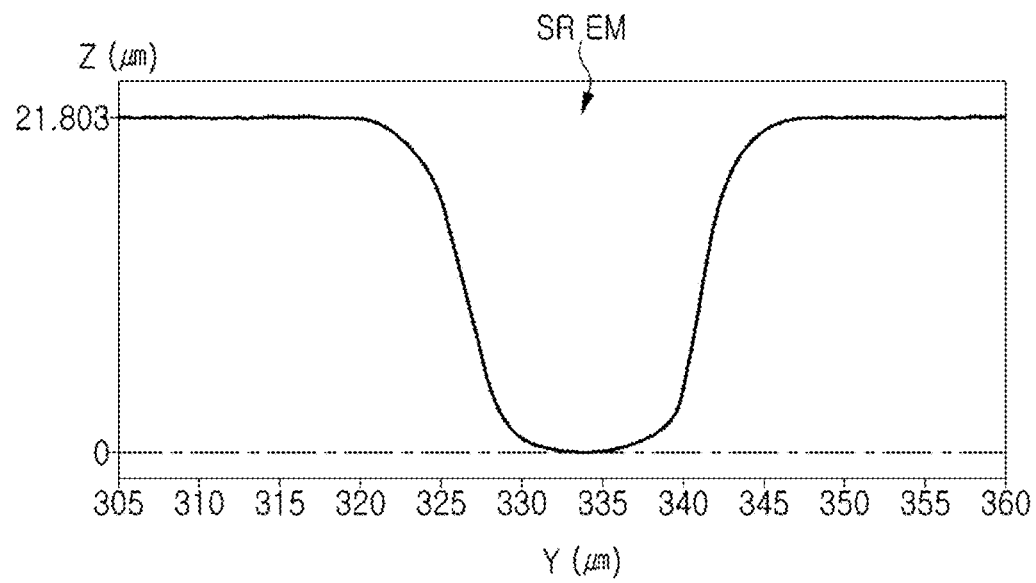
FIG. 4A is a graph illustrating a thickness and size of a solder resist structure according to a point Y in the center of one of the openings/depressions in FIG. 3C in which no solder resist patch is disposed.
Figure 4B:
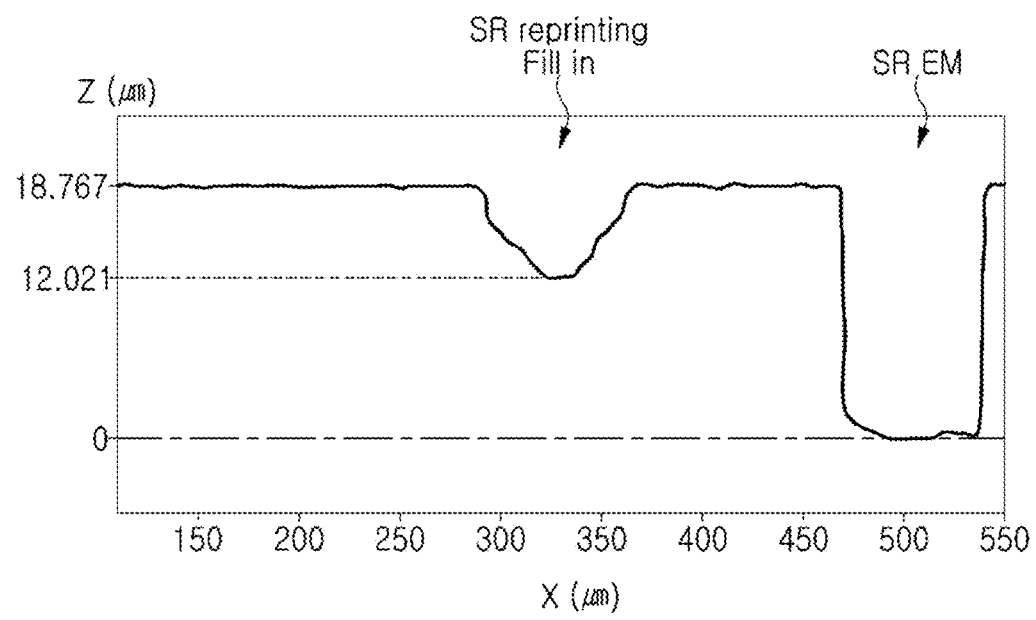
FIG. 4B shows a thickness and size of a solder resist structure according to point X in the center of one of the openings/depressions in which a solder resist patch is disposed and a thickness and size of a solder resist structure according to point X in the center of one of the openings/depressions in which a solder resist patch is not disposed.

Referring to FIGS. 4A and 4B, the thickness of the opening/depression (SR EM) in which the solder resist patch is not disposed may be 21.803 μm or 18.767 μm, which is the same as a thickness of the solder resist layer.

Referring to FIG. 4B, a thickness of a concave portion in the opening/depression (SR reprinting Fill in) in which the solder resist patch is disposed may be (18.767 μm−12.021 μm=6.746 μm), which may be about 35% of 18.767 μm that is the thickness of the solder resist layer.

When the calculation is performed by changing the 18.767 μm to 21.803 μm in FIG. 4A, the thickness of the concave portion may be about 45% of the thickness of the solder resist layer. Accordingly, the center value of the thickness range of the concave portion may be about 40% of the thickness of the solder resist layer, and the thickness of the concave portion may fall within a range greater than 10% and less than 70% of the thickness of the solder resist layer. Similarly, a center value of a thickness range of the solder resist patch may be about 60% of the thickness of the solder resist layer, and the thickness of the solder resist patch may fall within a range greater than 30% and less than 90% of the thickness of the solder resist layer.

In addition, an average width of the concave portion in the opening/depression (SR reprinting Fill in) where the solder resist patch is disposed may be about 35 μm. Accordingly, an average of the center thickness of each of the at least one concave portion may be shorter than an average of a maximum width of each of the at least one concave portion.

Figure 5A:
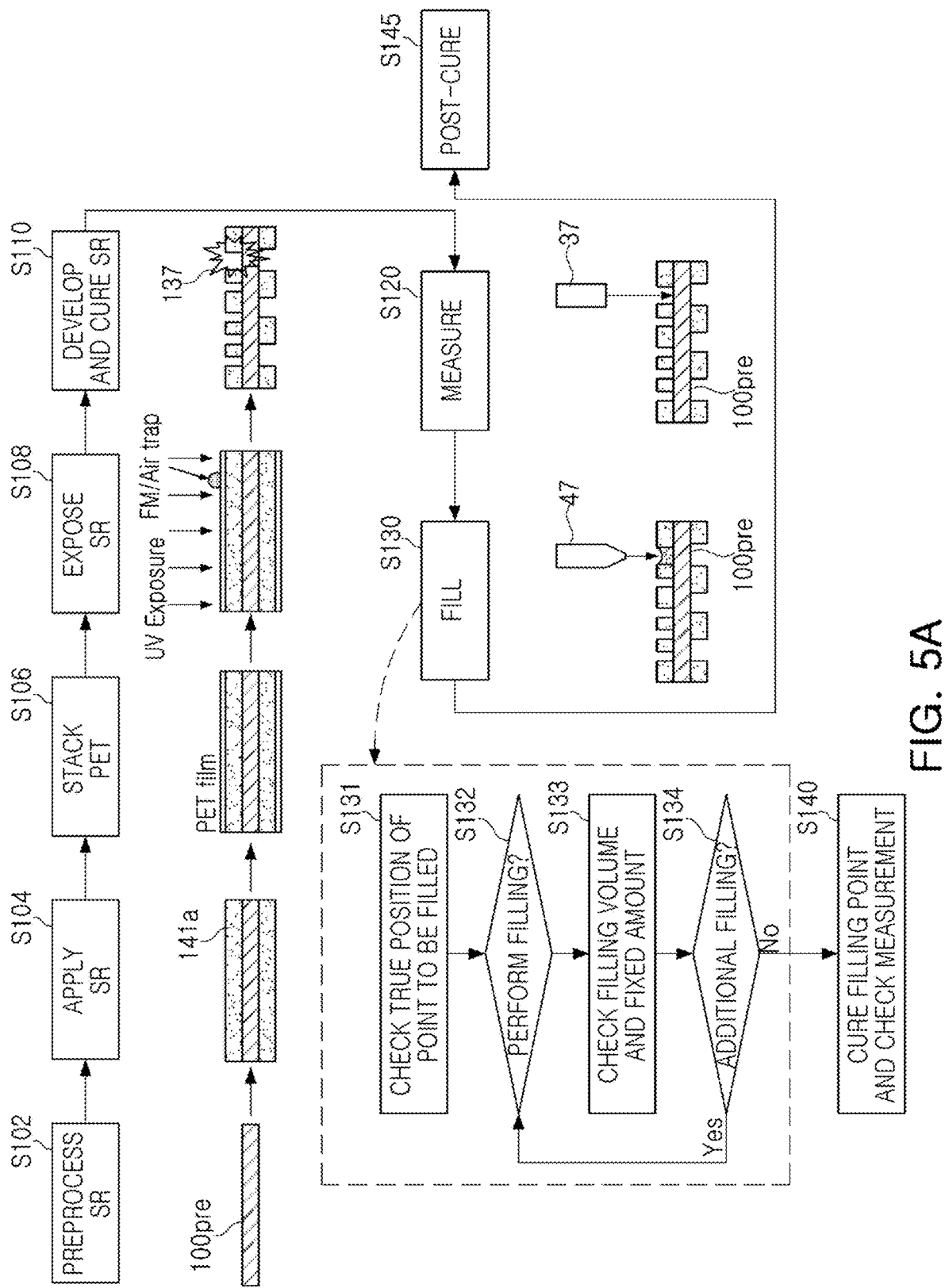
FIG. 5A is a diagram illustrating a method of manufacturing a PCB according to an exemplary embodiment in the present disclosure.

Referring to FIG. 5A, a method of manufacturing a PCB according to an exemplary embodiment in the present disclosure may include curing a solder resist layer 141a of an unfinished PCB 100pre (S110), obtaining thickness and size measurement values of a plurality of points of the solder resist layer 141a (S120), filling a solder resist material at a point corresponding to a thickness and size measurement value falling within a target range, among the thickness and size measurement values of the plurality of points (S130), and curing the point filled with the solder resist material, among the plurality of points, and measuring and checking whether a thickness and size of the filled point after curing fall within the target range (S140).

Accordingly, the curing time of the filled solder resist material and the curing time of the solder resist layer 141a may be different from each other. Accordingly, an interface may be formed between the filled solder resist material and the solder resist layer 141a, or an upper surface of the filled solder resist material may have a concave shape, but is not limited thereto.

For example, each of the operation (S140) of curing the filled point and the operation (S110) of curing the solder resist layer may include curing using ultraviolet rays, and the size of the cured region in the operation (S140) of curing the filled point may be smaller than the size of the cured region in the operation (S110) of curing the solder resist layer. For example, in the operation (S140) of curing the filled point, only the substantially filled solder resist material may be cured.

Referring to FIG. 5A, the method for manufacturing a PCB according to an exemplary embodiment in the present disclosure may further include: pre-processing (e.g., water washing) an unfinished PCB 100pre before application of a solder resist (SR) (S102), applying a solder resist SR to the unfinished PCB 100pre to form a solder resist layer 141a (S104), stacking a PET film on the solder resist layer 141a (S106), patterning the solder resist layer 141a using a photolithography (exposure) process (S108), and finally thermally curing the solder resist structure (S145).

Referring to FIG. 5A, the operation (S130) of filling the solder resist material may include checking a true position of a point determined by distinguishing between true and false of a point to be filled based on the obtained thickness and size measurement value (S131), determining a filling fixed volume of the checked point and whether to perform filling (S132), checking a filled volume and fixed amount by measuring a thickness and size with an optical microscope image (S133), and determining whether to perform additional filling after filling (S134).

For example, a laser displacement measuring device 37 may obtain images and thickness and size measurement values of a plurality of points of the solder resist layer 141a, while moving in a horizontal direction, and a filler 47 may move to a point at which the thickness and size measurement value is 0% or greater and less than 50% (target range) of the thickness of the solder resist layer 141a to fill a solder resist material according to an ink-jet method, and after filling, the filler 47 may perform additional filling if the thickness is not sufficiently thick. For example, the filling volume may be identified based on a width and minimum thickness of a region in which points at which the thickness measurement value is 0% or more and less than 50% are continued.

For example, the operation (S130) of filling the solder resist material may include filling a solder resist material by applying an electric field or a voltage corresponding to a thickness and size measurement value that falls within the target range, among thickness and size measurement values of a plurality of points to an electro hydro dynamics (EHD) ink-jet method.

Figure 5B:
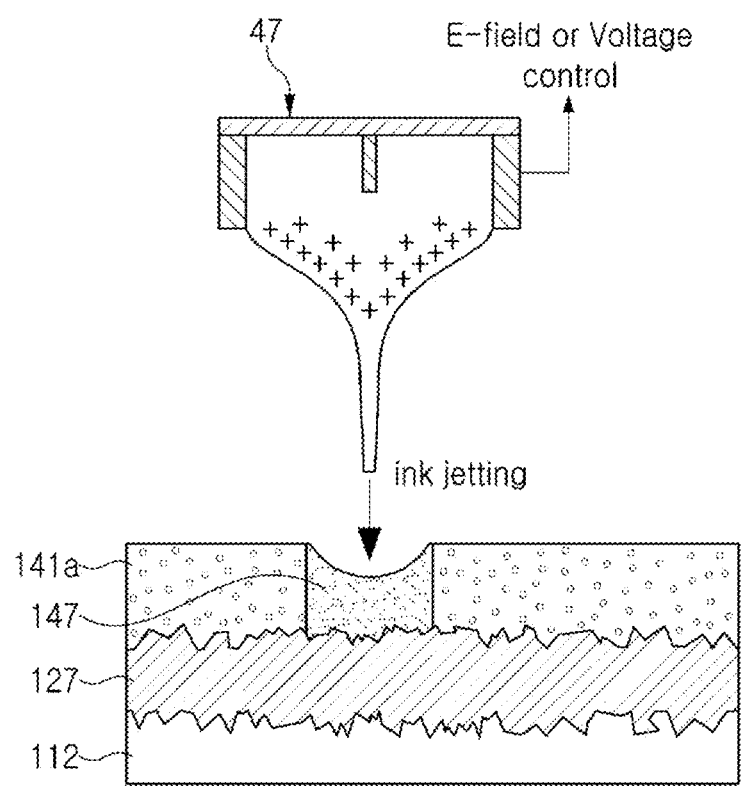
FIG. 5B is a diagram illustrating an operation of filling a solder resist material in a method for manufacturing a PCB according to an exemplary embodiment in the present disclosure.

Referring to FIG. 5B, the filler 47 may move to an upper side of an opening of the solder resist layer 141a, and the volume of the filled solder resist patch 147 may be controlled through an electric field (E-field) or voltage.

The EHD ink-jet method may be effective when the solder resist material is in a liquid state, and when the solder resist layer 141a is formed in a solid state, the solder resist layer 141a may be formed according to a method (e.g., dry film solder resist (DFSR) lamination) different from the EHD ink-jet method.

Figure 6:
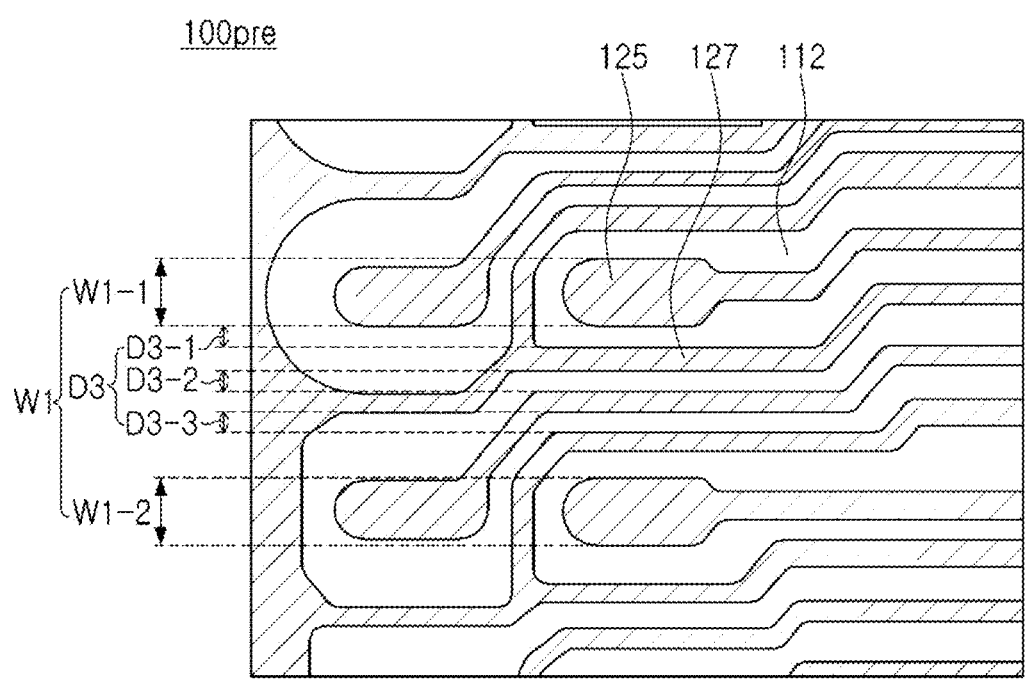
FIG. 6 is a plan view illustrating an insulating layer and a conductive layer before a solder resist structure is disposed on a PCB according to an exemplary embodiment in the present disclosure.

Referring to FIG. 6, an upper surface of the unfinished PCB 100pre before the solder resist layer is formed may include an upper surface of the insulating layer 112, the pad 125 and the conductive layer 127. An average W1 of widths W1-1 and W1-2 of a plurality of pads 125 may be wider than an average D3 of intervals D3-1, D3-2, and D3-3 between the plurality of pads 125 and the conductive layer 127.

Figure 7A:
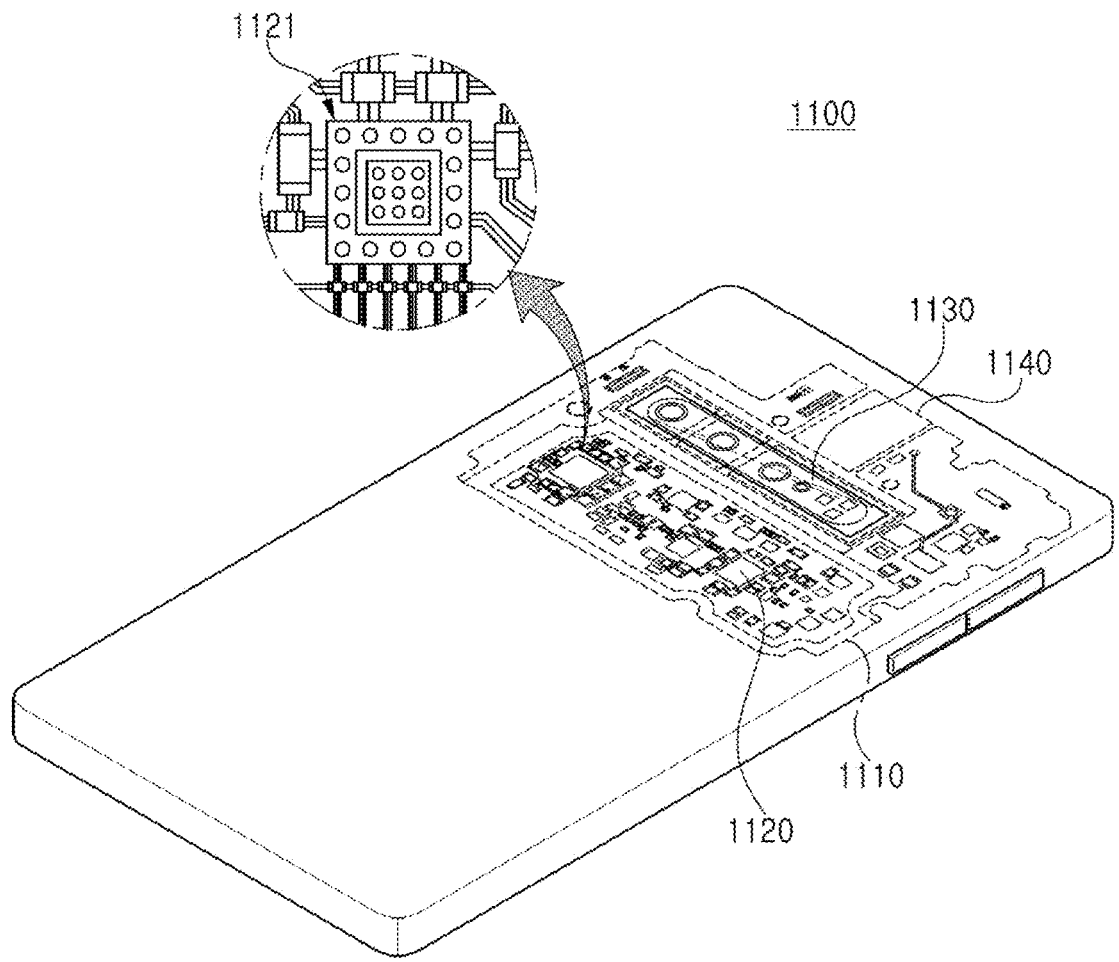
FIG. 7A is a diagram illustrating a structure of an electronic device in which a PCB may be disposed according to an exemplary embodiment in the present disclosure.
Figure 7B:
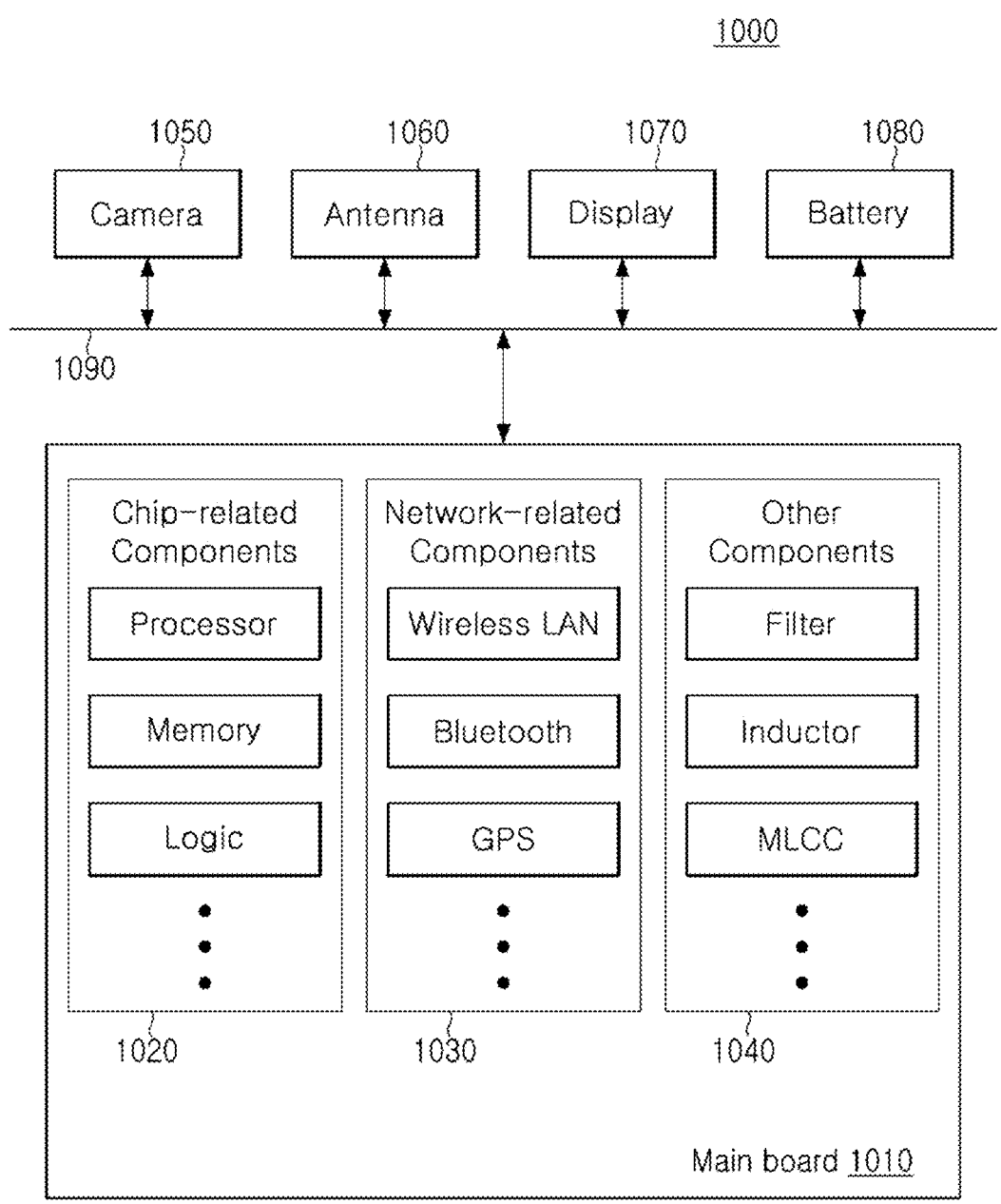
FIG. 7B is a diagram illustrating a system of an electronic device in which a PCB may be disposed according to an exemplary embodiment in the present disclosure.

FIG. 7A is a diagram illustrating a structure of an electronic device in which a PCB may be disposed according to an exemplary embodiment in the present disclosure, and FIG. 7B is an electronic device in which a PCB according to an exemplary embodiment in the present disclosure may be disposed.

Referring to FIGS. 7A and 7B, the electronic device 1000 may accommodate a main board 1010. A chip-related component 1020, a network-related component 1030, and other components 1040 may be physically and/or electrically connected to the main board 1010. These may be combined with other electronic components to be described later to form various signal lines 1090.

The chip-related component 1020 includes a memory chip, such as a volatile memory (e.g., DRAM), a non-volatile memory (e.g., ROM), and a flash memory; application processor chips, such as a central processing unit (CPU), a graphics processing unit (GPU), a digital signal processor, an encryption processor, a microprocessor, and a microcontroller; logic chips, such as analog-to-digital converters (ADCs) and application-specific integrated chips (ASICs), but is not limited thereto, and may include other types of chip-related electronic components. Also, of course, these chip-related components 1020 may be combined with each other. The chip-related component 1020 may be in the form of a package including the chips or electronic components described above.

The network-related components 1030 include Wi-Fi (IEEE 802.11 family, etc.), WiMAX (IEEE 802.16 family, etc.), IEEE 802.20, long term evolution (LTE), Ev-DO, HSPA+, HSDPA+, HSUPA+, EDGE, GSM, GPS, GPRS, CDMA, TDMA, DECT, Bluetooth, 3G, 4G, 5G and any other wireless and wired protocols designated thereafter, and but the present disclosure is not limited thereto and may include any other wireless or wired protocols and certain protocols. Also, the network-related component 1030 may be combined with the chip-related component 1020.

The other components 1040 may include a high frequency inductor, a ferrite inductor, a power inductor, ferrite beads, low temperature co-firing ceramics (LTCC), an electromagnetic interference (EMI) filter, a multilayer ceramic condenser (MLCC), and the like. However, the present disclosure is not limited thereto and may include a passive element in the form of a chip component used for various other purposes in addition thereto. In addition, the other component 1040 may be combined with the chip-related component 1020 and/or the network-related component 1030.

Depending on the type of the electronic device 1000, the electronic device 1000 may include other electronic components that may or may not be physically and/or electrically connected to the main board 1010. Examples of other electronic components include a camera module 1050, an antenna module 1060, a display 1070, and a battery 1080. However, the present disclosure is not limited thereto, and the other electronic component may include an audio codec, a video codec, a power amplifier, a compass, an accelerometer, a gyroscope, a speaker, a mass storage device (e.g., a hard disk drive), a compact disk (CD), a digital versatile disk (DVD), etc. In addition to this, other electronic components used for various purposes may be included depending on the type of the electronic device 1000.

The electronic device 1000 may be a smart phone, a personal digital assistant, a digital video camera, a digital still camera, a network system, a computer, a monitor, a tablet, a laptop, a netbook, a television, a video game player, a smart watch, an automotive, and the like. However, the present disclosure is not limited thereto and may be any other electronic device that processes data in addition thereto.

The electronic device may be, for example, a smartphone 1100. A motherboard 1110 is accommodated inside the smartphone 1100, and various components 1120 are physically and/or electrically connected to the motherboard 1110. Also, other components that may or may not be physically and/or electrically connected to the motherboard 1110, such as a camera module 1130 and/or a speaker 1140, may be accommodated therein. A portion of the component 1120 may be the chip-related component described above, for example, a component package 1121, but is not limited thereto. The component package 1121 may be in the form of a PCB on which electronic components including active components and/or passive components are surface-mounted. Alternatively, the component package 1121 may be in the form of a PCB in which active and/or passive components are embedded. Meanwhile, the electronic device is not necessarily limited to the smartphone 1100, and of course, may be other electronic devices as described above.

Since the PCB according to an embodiment of the present invention may include an efficiently formed solder resist, the degree of integration of the provided electrical connection path may be efficiently increased, or the PCB may have a larger size or a greater number of conductive layers.

Since the PCB manufacturing method according to an embodiment of the present invention can efficiently reduce the defect rate of solder resist, the PCB mass production capacity can be efficiently increased, or a PCB having a larger size or a larger number of conductive layers can be produced efficiently.

While exemplary embodiments have been illustrated and described above, it will be apparent to those skilled in the art that modifications and variations could be made without departing from the scope of the present disclosure as defined by the appended claims.

What is claimed is:

1. A printed circuit board (PCB) comprising:
   a solder resist layer including at least one of an opening and a depression, wherein the opening and the depression each are recessed from a portion of an upper surface of the solder resist layer towards a lower surface of the solder resist layer such that the upper surface and each of the opening and the depression have an edge; and
   a solder resist patch disposed in at least one of the opening and the depression to have an interface with the solder resist layer in at least one of the opening and the depression,
   wherein the portion of the upper surface of the solder resist layer is exposed from the solder resist patch.

2. The PCB of claim 1, wherein an inorganic filler content of the solder resist layer is higher than an inorganic filler content (including 0%) of the solder resist patch.

3. The PCB of claim 1, wherein a thickness variation of the solder resist patch is greater than a thickness variation of the solder resist layer.

4. The PCB of claim 1, wherein an upper surface of the solder resist patch is more concave than the upper surface of the solder resist layer.

5. The PCB of claim 1, further comprising:
   an insulating layer including a material different from that of the solder resist patch; and
   a conductive layer at least partially disposed between the insulating layer and the solder resist patch.

6. The PCB of claim 1, wherein the solder resist layer further includes a connection opening in which the solder resist patch is not disposed.

7. The PCB of claim 1, wherein the solder resist patch is disposed at least in the opening, and
   a center thickness of the solder resist patch is greater than 30% and less than 90% of a center thickness of the opening.

8. The PCB of claim 7, wherein a thickness of the solder resist layer is less than 30 μm.

9. A printed circuit board (PCB) comprising:
   an insulating layer;
   a conductive layer disposed on the insulating layer; and a solder resist structure constituting a solder resist layer and having at least one concave portion located on at least a portion of the conductive layer on an upper surface of the solder resist layer, wherein an average of the center thickness of the at least one concave portion is greater than 10% and less than 70% of a thickness of a portion not overlapping the at least one concave portion in the solder resist structure.

10. The PCB of claim 9, wherein
the solder resist structure further includes a connection opening which exposes another portion of the conductive layer, and
a thickness variation of the at least one concave portion is greater than a thickness variation of the connection opening.

11. The PCB of claim 9, wherein an average of the center thickness of the at least one concave portion is shorter than an average width of the at least one concave portion.

12. The PCB of claim 9, wherein, in the solder resist structure, an inorganic filler content (including 0%) of a portion between the at least one concave portion and at least a portion of the conductive layer is lower than an inorganic filler content of another portion of the solder resist structure surrounding the at least one concave portion.

13. The PCB of claim 9, wherein brightness of a portion between the at least one concave portion in the solder resist structure and at least a portion of the conductive layer is different from brightness of another portion of the solder resist structure surrounding the at least one concave portion.

14. The PCB of claim 9, wherein
a thickness of a portion of the solder resist structure that does not overlap the at least one concave portion is less than 30 μm, and
a center thickness of the at least one concave portion having a thickest center thickness in the at least one concave portion is less than 50% of the thickness of the solder resist layer.

15. A method for manufacturing a printed circuit board (PCB), the method comprising:
curing a solder resist layer of an unfinished PCB;
obtaining thickness and size measurement values of a plurality of points of the solder resist layer;
filling a solder resist material at a point corresponding to a thickness and size measurement value falling within a target range, among the thickness and size measurement values of the plurality of points; and
curing the point filled with the solder resist material, among the plurality of points, and measuring and checking whether a thickness and size of the filled point after curing fall within the target range.

16. The method of claim 15, wherein a size of a cured region in the curing the filled point is smaller than a size of a cured region in the curing of the solder resist layer.

17. The method of claim 16, wherein each of the curing of the filled point and the curing of the solder resist layer includes curing using ultraviolet rays.

18. The method of claim 15, further comprising:
forming the solder resist layer before curing the solder resist layer,
wherein the filling of the solder resist material includes filling the solder resist material according to an electro hydrodynamics (EHD) ink-jet method, and
the forming of the solder resist layer includes forming the solder resist layer according to a method different from the EHD ink-jet method.

19. The method of claim 15, wherein the filling of the solder resist material includes filling the solder resist material by applying an electric field or voltage corresponding to the thickness and size measurement values falling within the target range, among the thickness and size measurement values of the plurality of points, to an EHD ink-jet apparatus used in an EHD ink-jet method.

20. A printed circuit board (PCB) comprising:
an insulating layer;
a conductive layer disposed on the insulating layer and including a first conductive pattern and a second conductive pattern; and
a solder resist structure comprising a solder resist layer and a solder resist pattern,
wherein a property of the solder resist pattern is different from a property of the solder resist layer,
the solder resist layer covers a portion of the insulating layer and has an opening exposing a portion of the first conductive pattern, and
the solder resist pattern is disposed on the second conductive pattern and is in contact with the solder resist layer.

21. The PCB of claim 20, wherein a material of the solder resist pattern is different from a material of the solder resist layer.

22. The PCB of claim 20, wherein an inorganic filler content of the solder resist layer is higher than an inorganic filler content (including 0%) of the solder resist pattern.

23. The PCB of claim 20, wherein brightness of the solder resist pattern is different from brightness of a portion of the solder resist layer surrounding the solder resist pattern.

24. The PCB of claim 20, wherein the solder resist pattern is recessed with respect to a portion of the solder resist layer surrounding the solder resist pattern.

* * * * *